(12) United States Patent
Nakazawa et al.

(10) Patent No.: US 10,971,466 B2
(45) Date of Patent: Apr. 6, 2021

(54) HIGH FREQUENCY MODULE AND COMMUNICATION DEVICE

(71) Applicant: Murata Manufacturing Co., Ltd., Kyoto (JP)

(72) Inventors: Katsunari Nakazawa, Kyoto (JP); Takanori Uejima, Kyoto (JP); Motoji Tsuda, Kyoto (JP); Yuji Takematsu, Kyoto (JP); Dai Nakagawa, Kyoto (JP); Tetsuro Harada, Kyoto (JP); Masahide Takebe, Kyoto (JP); Naoya Matsumoto, Kyoto (JP); Yoshiaki Sukemori, Kyoto (JP); Mitsunori Samata, Kyoto (JP); Yutaka Sasaki, Kyoto (JP); Yuuki Fukuda, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 140 days.

(21) Appl. No.: 16/533,982

(22) Filed: Aug. 7, 2019

(65) Prior Publication Data

US 2020/0051943 A1    Feb. 13, 2020

(30) Foreign Application Priority Data

Aug. 9, 2018   (JP) .............................. JP2018-150622

(51) Int. Cl.
*H03F 3/21*    (2006.01)
*H03F 1/30*    (2006.01)
(Continued)

(52) U.S. Cl.
CPC .......... *H01L 24/17* (2013.01); *H01L 23/3675* (2013.01); *H01L 23/5384* (2013.01);
(Continued)

(58) Field of Classification Search
CPC ............. H01L 24/16; H01L 2224/1403; H01L 2224/13147; H01L 2924/1305;
(Continued)

(56) References Cited

U.S. PATENT DOCUMENTS

| 7,396,701 | B2 * | 7/2008 | Shigemura | .......... | H01L 23/3121 |
| | | | | | 438/108 |
| 8,742,499 | B2 * | 6/2014 | Nakajima | ............... | H01L 23/66 |
| | | | | | 257/341 |

(Continued)

FOREIGN PATENT DOCUMENTS

JP    2010-267944 A    11/2010

*Primary Examiner* — Hieu P Nguyen
(74) *Attorney, Agent, or Firm* — Pearne & Gordon LLP

(57) ABSTRACT

A high frequency module includes a transmission power amplifier, a bump electrode connected to the transmission power amplifier, and a mounting board on which the transmission power amplifier is mounted, wherein the mounting board includes a via conductor having an elongated shape in the plan view of the mounting board, a board main part placed outside the via conductor, and an insulating part placed inside the via conductor, and the bump electrode and the via conductor are connected while at least partially overlapping each other in the foregoing plan view, and the board main part and the insulating part are each composed of an insulating material of the same kind.

20 Claims, 10 Drawing Sheets

(51) Int. Cl.
*H01L 23/00* (2006.01)
*H01L 25/16* (2006.01)
*H01L 23/66* (2006.01)
*H01L 23/367* (2006.01)
*H01L 23/538* (2006.01)
*H04B 1/40* (2015.01)

(52) U.S. Cl.
CPC .............. *H01L 23/66* (2013.01); *H01L 24/16* (2013.01); *H01L 25/16* (2013.01); *H03F 1/301* (2013.01); *H03F 1/302* (2013.01); *H03F 3/211* (2013.01); *H01L 2223/6644* (2013.01); *H01L 2224/16057* (2013.01); *H01L 2224/16235* (2013.01); *H01L 2224/1703* (2013.01); *H01L 2924/13051* (2013.01); *H01L 2924/13091* (2013.01); *H03F 2200/171* (2013.01); *H03F 2200/294* (2013.01); *H03F 2200/451* (2013.01); *H03F 2203/21157* (2013.01); *H04B 1/40* (2013.01)

(58) Field of Classification Search
CPC ... H01L 2924/13091; H01L 2223/6644; H01L 2223/6616; H01L 23/49822; H01L 23/3677; H01L 2224/17519; H01L 2224/13014; H01L 24/17; H01L 2224/13082; H01L 23/66; H01L 24/14; H01L 24/13; H01L 2224/13016; H01L 2224/16235; H03F 2200/451; H03F 2200/387; H03F 2200/222; H03F 3/245; H03F 3/191; H03F 3/19; H03F 3/211; H03F 1/30; H03F 3/213; H03F 3/68; H03F 1/301; H03F 1/302; H03F 2200/294; H03F 2200/171; H04B 1/006; H04B 1/04; H04B 2001/0408
USPC .......................................... 330/277, 307, 289
See application file for complete search history.

(56) References Cited

U.S. PATENT DOCUMENTS

2010/0109052 A1   5/2010   Nakajima
2020/0051941 A1*  2/2020   Nakazawa ............. H04B 1/006

* cited by examiner

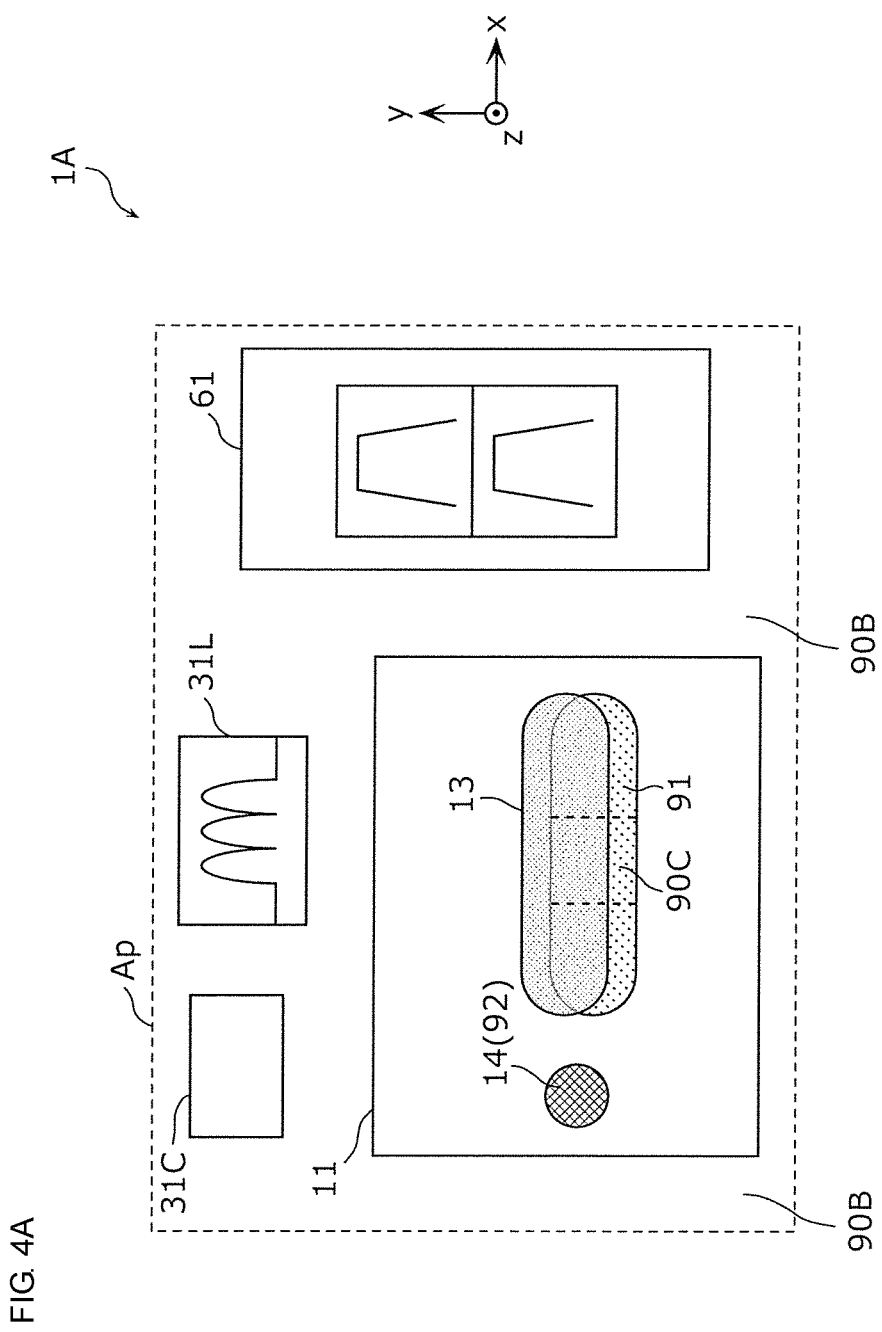

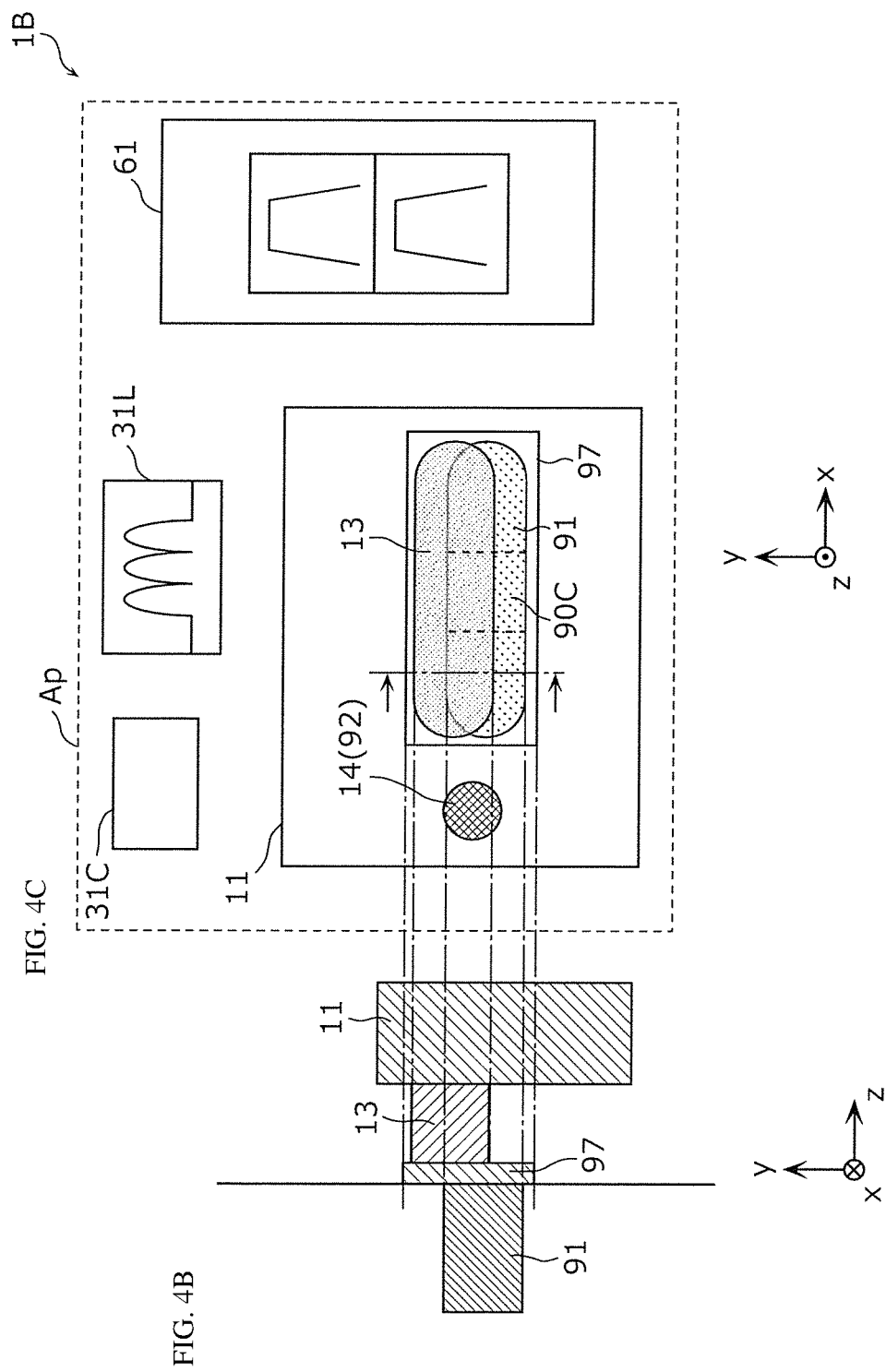

HIGH FREQUENCY MODULE AND COMMUNICATION DEVICE

This application claims priority from Japanese Patent Application No. 2018-150622 filed on Aug. 9, 2018. The content of this application is incorporated herein by reference in its entirety.

BACKGROUND OF THE DISCLOSURE

1. Field of the Disclosure

The present disclosure relates to high frequency modules and communication devices.

2. Description of the Related Art

In mobile communication devices such as cellular phones and the like, particularly, with the development of multi-banding, it is necessary to densely mount circuit elements that form a high frequency front-end circuit. When densely mounting the circuit elements, a heat dissipation measure for an amplifier circuit and a passive element, through which a high frequency signal outputted from the amplifier circuit passes, becomes important.

Japanese Unexamined Patent Application Publication No. 2010-267944 (Hereinafter, referred to as Patent Document 1) discloses a power amplifier module having a semiconductor chip including a power amplifier circuit, and a wiring board (mounting board) on which the semiconductor chip is mounted. A bump electrode connected to a source of the semiconductor chip has a so-called elongated shape in which a plurality of ball bumps is connected in an elongated manner. According to this configuration, the power amplifier module enables to dissipate the heat generated at the power amplifier circuit from the bump electrode connected to the source to a backside terminal of the wiring board via a plurality of source vias (VH1S-VH3S) formed in the wiring board.

BRIEF SUMMARY OF THE DISCLOSURE

As in the power amplifier module disclosed in Patent Document 1, for increasing heat dissipation ability of the semiconductor chip, it is effective to form the bump electrode connected to the semiconductor chip into an elongated shape. In this case, in order to increase the heat dissipation ability of the semiconductor chip and further increase the heat dissipation ability of the power amplifier module, it is effective to further form a via in the wiring board (mounting board), which is to be connected to the foregoing elongated-shape bump electrode, into an elongated shape that matches with the shape of the foregoing bump electrode.

However, in the case where a via in the wiring board has an elongated shape in the plan view of the wiring board, the filling amount of a conducting member that forms the via varies depending on the position inside the via. This causes the via to have an irregular shape at the surface of the wiring board, thereby posing an issue of the degraded flatness of the wiring board.

The present disclosure is made to resolve the foregoing issue, and an object thereof is to provide a high frequency module and a communication device that ensure the flatness of a mounting board while improving the heat dissipation ability.

In order to achieve the foregoing object, a high frequency module according to preferred embodiments of the present disclosure includes a high frequency component, a connection electrode connected to the high frequency component, and a mounting board on which the high frequency component is mounted, wherein the mounting board includes a via conductor having an elongated shape in a plan view of the mounting board, a first insulating part disposed outside the via conductor, and a second insulating part disposed inside the via conductor, the connection electrode and the via conductor are connected while at least partially overlapping one another in the plan view, and the first insulating part and the second insulating part are each composed of an insulating material of same kind.

Other features, elements, characteristics and advantages of the present disclosure will become more apparent from the following detailed description of preferred embodiments of the present disclosure with reference to the attached drawings.

BRIEF DESCRIPTION OF THE SEVERAL VIEWS OF THE DRAWINGS

FIG. 4A is a schematic plan view illustrating a second mounting arrangement of a power amplifier included in a high frequency module according to a modified example 1 of an embodiment;

Figure 5:
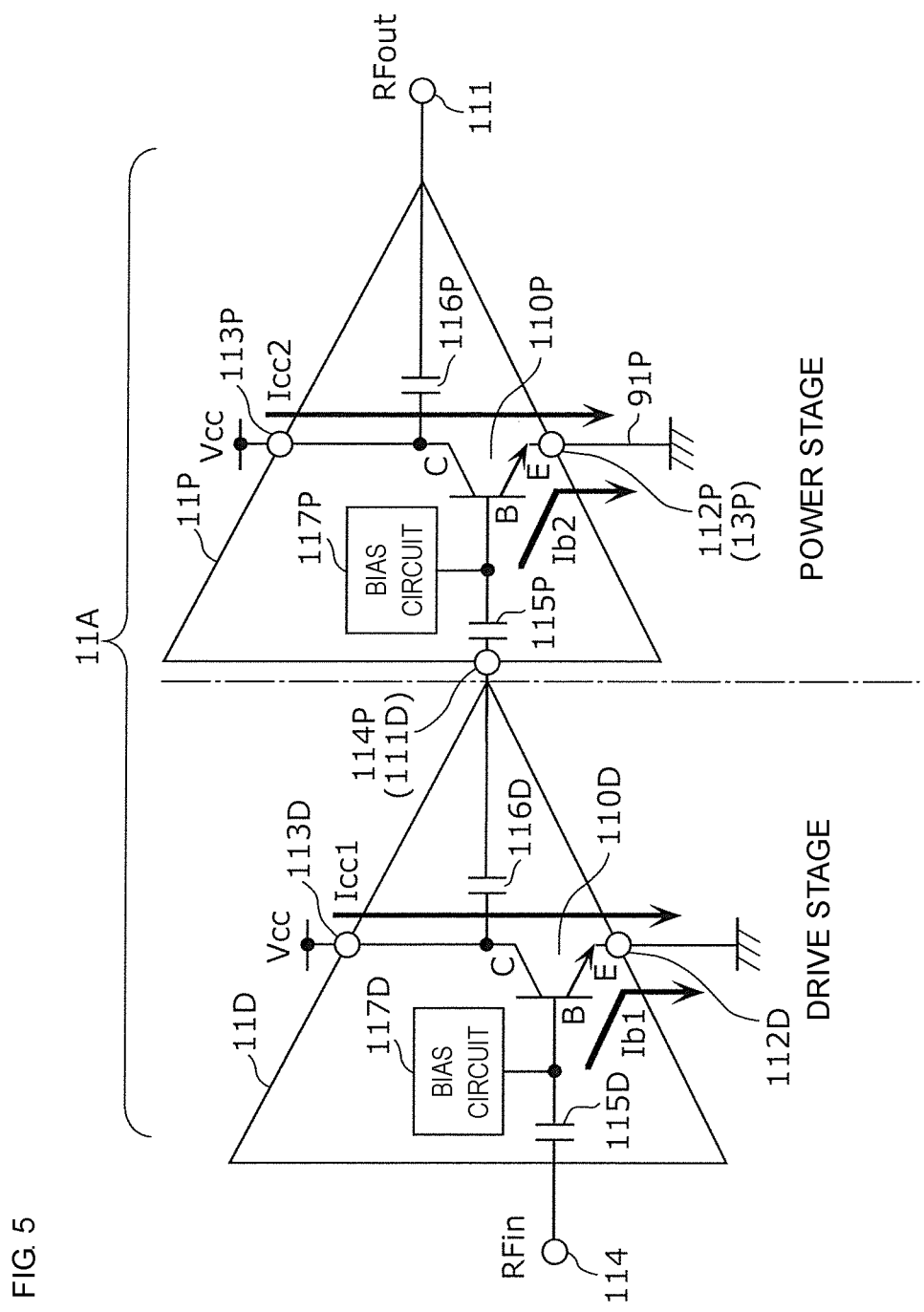
Figure 6A:
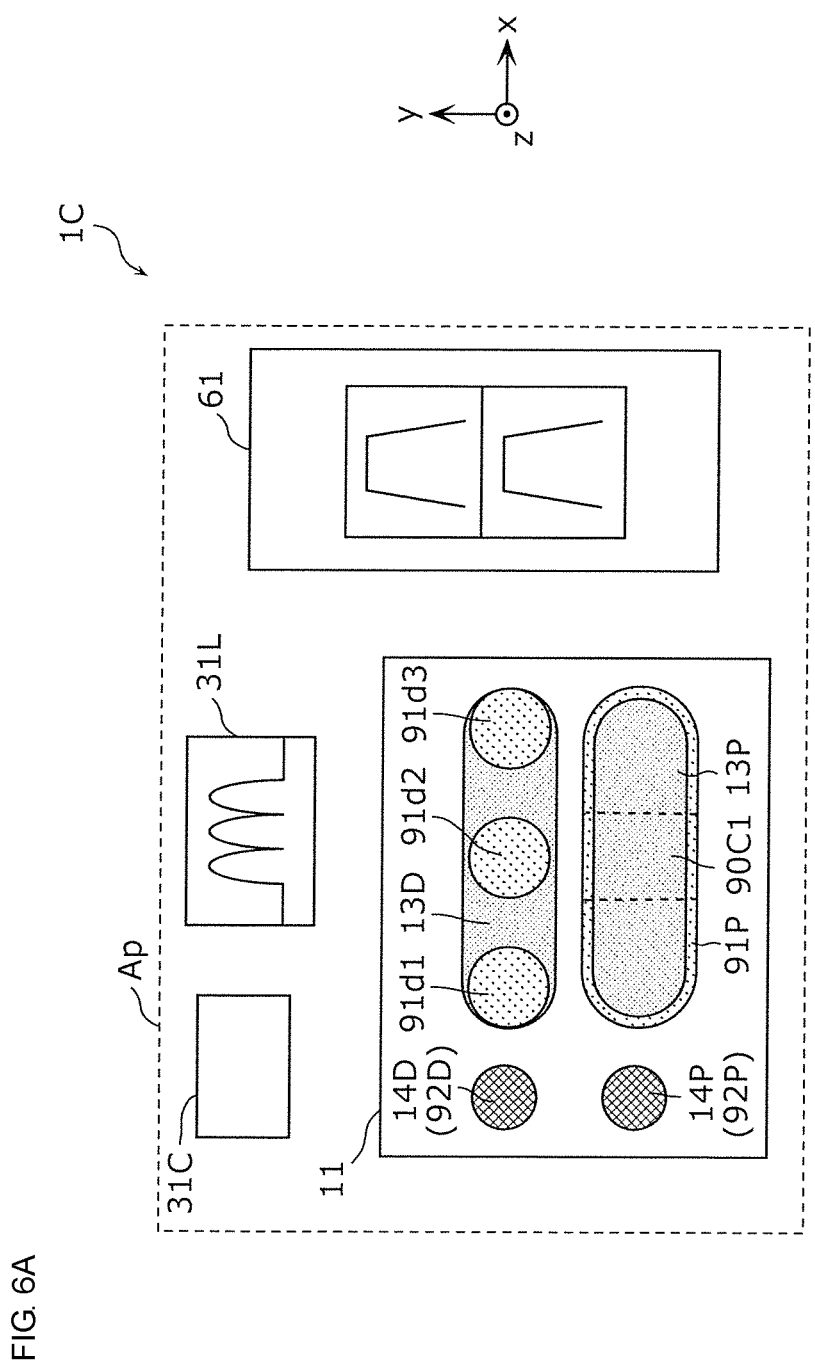
Figure 6B:
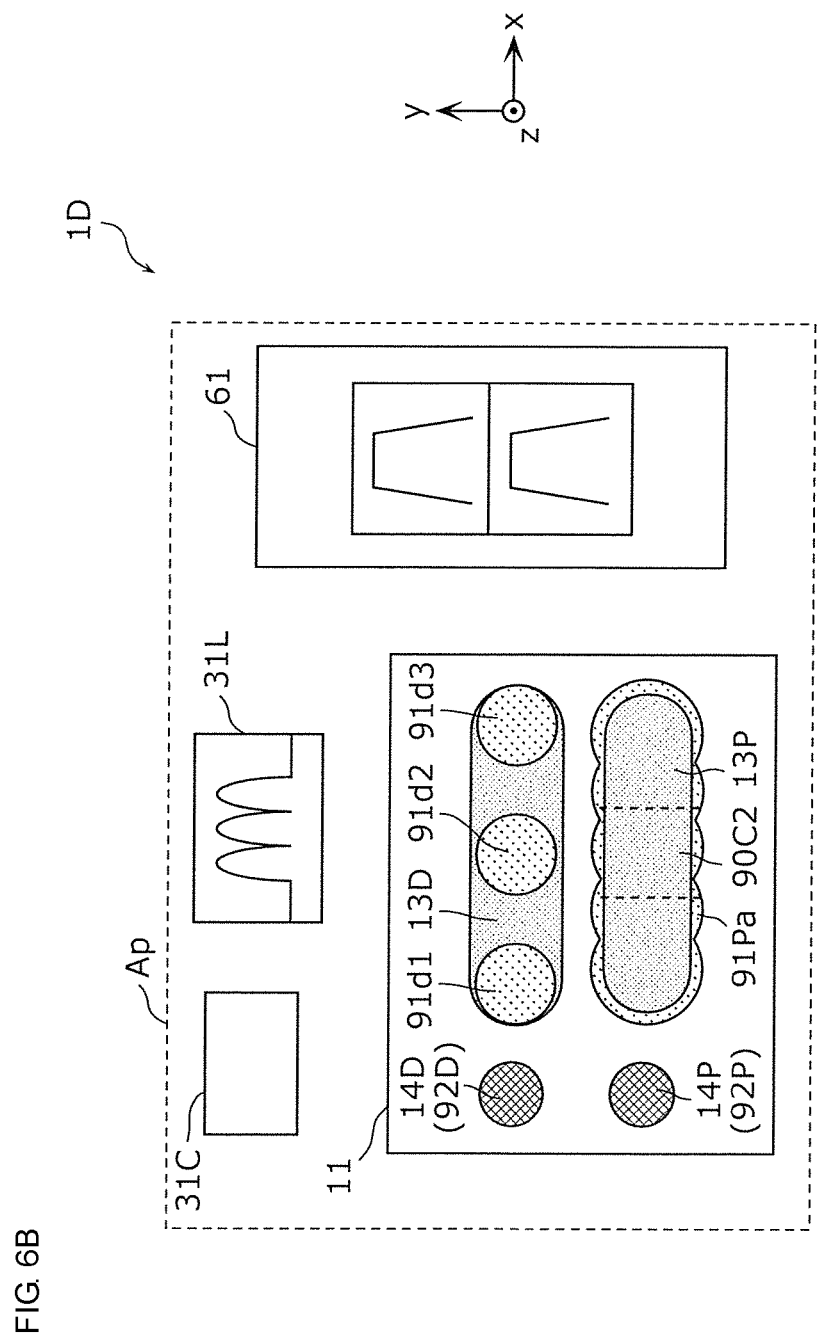

Each of FIGS. 4B and 4C is a schematic plan view illustrating a third mounting arrangement of a power amplifier included in a high frequency module according to a modified example 2 of an embodiment;

FIG. 5 is a circuit configuration diagram of a power amplifier included in a high frequency module according to a modified example 3 of an embodiment;

FIG. 6A is a schematic plan view illustrating a fourth mounting arrangement of a power amplifier included in a high frequency module according to the modified example 3 of an embodiment; and FIG. 6B is a schematic plan view illustrating a fifth mounting arrangement of a power amplifier included in a high frequency module according to a modified example 4 of an embodiment.

DETAILED DESCRIPTION OF THE DISCLOSURE

Hereinafter, an embodiment of the present disclosure and modified examples thereof will be described in detail with reference to the drawings. Note that the embodiment and the modified examples thereof, which will be described below, each illustrate a comprehensive or specific example. Numeric values, shapes, materials, constituting elements, arrangements and connection modes of the constituting elements, and the like illustrated in the following embodiment and modified examples thereof are mere examples, and not intended to limit the present disclosure. Of constituting elements in the following embodiment and modified examples thereof, the constituting elements that are not described in an independent claim will be described as optional constituting elements. Further, dimensions or ratios of dimensions of constituting elements illustrated in the drawings are not necessarily be precise.

Note that, in the following embodiment and modified examples thereof, "A and B are connected" is defined to mean either (1) A and B are in direct contact with each other or (2) A and B are in contact with each other with a conducting film interposed therebetween (A and B are in contact with a top side and a back side of the conducting film, respectively). Further, "A and B are electrically connected" is defined to include a case where A and B are indirectly connected via conductive wiring, and A and B may not be in direct contact with each other.

Note that, in the following embodiment, with regard to A, B, and C mounted on a board, "C is placed between A and B in the plan view of the board (or a principal surface of the board)" is defined to mean that at least part of a projected area of C in the plan view of the board overlaps a line connecting an arbitrary point in a projected area of A in the plan view of the board and an arbitrary point in a projected area of B in the plan view of the board.

Embodiments

1. Circuit Configuration of High Frequency Module and Communication Device

Figure 1:
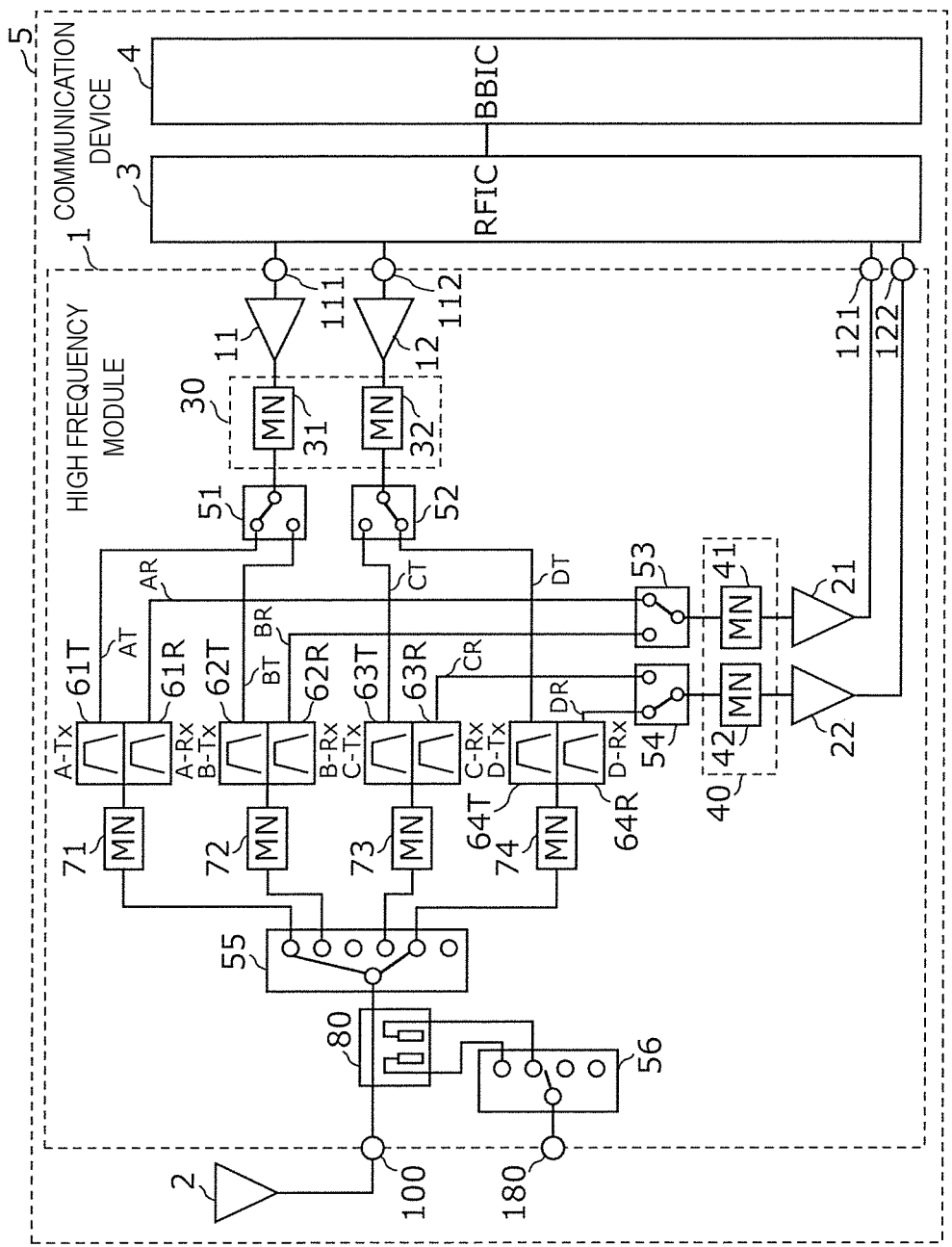
FIG. 1 is a diagram illustrating an exemplary circuit configuration of a high frequency module according to an embodiment.

FIG. 1 is the circuit configuration of a high frequency module 1 according to an embodiment. As illustrated in this figure, a communication device 5 includes the high frequency module 1, an antenna element 2, a RF signal processing circuit (RFIC) 3, and a baseband signal processing circuit (BBIC) 4.

RFIC 3 is a RF signal processing circuit that processes a high frequency signal received in or transmitted from the antenna element 2. Specifically, RFIC 3 performs signal processing on a high frequency reception signal inputted via a reception signal path of the high frequency module 1 using down-converting and the like, and outputs a reception signal generated by this signal processing to BBIC 4. Further, RFIC 3 performs signal processing on a transmission signal inputted from BBIC 4 using up-converting and the like, and outputs a high frequency transmission signal generated by this signal processing to a transmission signal path of the high frequency module 1.

BBIC 4 is a circuit that performs signal processing using an intermediate frequency band, which is at lower frequency than the high frequency signal traveling through the high frequency module 1. The signal having been processed in BBIC 4 is used as, for example, an image signal for image display or an audio signal for communication through a speaker.

Further, RFIC 3 also functions as a controller unit that controls the connections of switches 51, 52, 53, 54, 55, and 56 included in the high frequency module 1 based on a communication band (frequency band) to be used. Specifically, RFIC 3 switches the connections of the switches 51 to 56 included in the high frequency module 1 using control signals (not illustrated in the drawing). Alternatively, the controller unit may be provided outside RFIC 3, or may be provided, for example, inside the high frequency module 1 or BBIC 4.

The antenna element 2 is connected to a common terminal 100 of the high frequency module 1, transmits a high frequency signal outputted from the high frequency module 1, and receives a high frequency signal from outside and outputs to the high frequency module 1.

Note that, in the communication device 5 according to the present embodiment, the antenna element 2 and the BBIC 4 are not essential constituting elements.

Next, a detailed configuration of the high frequency module 1 is described.

As illustrated in FIG. 1, the high frequency module 1 includes the common terminal 100, a transmission power amplifiers 11 and 12, reception low-noise amplifiers 21 and 22, transmission filters 61T, 62T, 63T, and 64T, reception filters 61R, 62R, 63R, and 64R, a transmission output matching circuit 30, a reception input matching circuit 40, matching circuits 71, 72, 73, and 74, the switches 51, 52, 53, 54, 55, and 56, a coupler 80, and a coupler output terminal 180.

The common terminal 100 is connected to the antenna element 2.

The transmission power amplifier 11 is a power amplifier that amplifies a high frequency signal in a communication band A and a high frequency signal in a communication band B, the communication band A and the communication band B belonging to a first frequency band group. Further, the transmission power amplifier 12 is a power amplifier that amplifies a high frequency signal in a communication band C and a high frequency signal in a communication band D, the communication band C and the communication band D belonging to a second frequency band group on the high frequency side compared to the first frequency band group.

The reception low-noise amplifier 21 is a low-noise amplifier that performs low-noise amplification of a high frequency signal in the communication band A and a high frequency signal in the communication band B. Further, the reception low-noise amplifier 22 is a low-noise amplifier that performs low-noise amplification of a high frequency signal in the communication band C and a high frequency signal in the communication band D.

The transmission power amplifiers 11 and 12 and the reception low-noise amplifiers 21 and 22 each include, for example, a field-effect transistor (FET), a heterojunction bipolar transistor (HBT), or the like, which use complementary metal oxide semiconductor (CMOS) or GaAs as a material.

The transmission filter 61T is electrically connected to an output terminal of the transmission power amplifier 11 via the transmission output matching circuit 30 and the switch 51 and, of high frequency transmission signals amplified by the transmission power amplifier 11, allows a high frequency transmission signal in a transmission band of the communication band A to pass. Further, the transmission filter 62T is electrically connected to an output terminal of the transmission power amplifier 11 via the transmission output matching circuit 30 and the switch 51 and, of high frequency transmission signals amplified by the transmission power amplifier 11, allows a high frequency transmission signal in a transmission band of the communication band B to pass. Further, the transmission filter 63T is electrically connected to an output terminal of the transmission power amplifier 12 via the transmission output matching circuit 30 and the switch 52 and, of high frequency transmission signals amplified by the transmission power amplifier 12, allows a high frequency transmission signal in a transmission band of the communication band C to pass. Further, the transmission filter 64T is electrically connected to an output terminal of the transmission power amplifier 12 via the transmission output matching circuit 30 and the switch 52 and, of high frequency transmission signals amplified by the transmission power amplifier 12, allows a high frequency transmission signal in a transmission band of the communication band D to pass.

The reception filter 61R is electrically connected to an input terminal of the reception low-noise amplifier 21 via the reception input matching circuit 40 and the switch 53 and, of high frequency reception signals inputted from the common terminal 100, allows a high frequency reception signal in a reception band of the communication band A to pass. Further, the reception filter 62R is electrically connected to an input terminal of the reception low-noise amplifier 21 via the reception input matching circuit 40 and the switch 53 and, of high frequency reception signals inputted from the common terminal 100, allows a high frequency reception signal in a reception band of the communication band B to pass. Further, the reception filter 63R is electrically connected to an input terminal of the reception low-noise amplifier 22 via the reception input matching circuit 40 and the switch 54 and, of high frequency reception signals inputted from the common terminal 100, allows a high frequency reception signal in a reception band of the communication band C to pass. Further, the reception filter 64R is electrically connected to an input terminal of the reception low-noise amplifier 22 via the reception input matching circuit 40 and the switch 54 and, of high frequency reception signals inputted from the common terminal 100, allows a high frequency reception signal in a reception band of the communication band D to pass.

Note that the transmission filters 61T to 64T and the reception filters 61R to 64R described above may each be, for example, a surface acoustic wave filter, an acoustic wave filter using a bulk acoustic wave (BAW), a LC resonance filter, or a dielectric filter, but is not limited thereto.

The transmission filter 61T and the reception filter 61R form a duplexer 61 whose passband is the communication band A. Further, the transmission filter 62T and the reception filter 62R form a duplexer 62 whose passband is the communication band B. Further, the transmission filter 63T and the reception filter 63R form a duplexer 63 whose passband is the communication band C. Further, the transmission filter 64T and the reception filter 64R form a duplexer 64 whose passband is the communication band D.

The transmission output matching circuit 30 includes matching circuits 31 and 32. The matching circuit 31 is placed on a transmission path connecting the transmission power amplifier 11 and the transmission filters 61T and 62T and matches with the impedance between the transmission power amplifier 11 and the transmission filters 61T and 62T. The matching circuit 32 is placed on a transmission path connecting the transmission power amplifier 12 and the transmission filters 63T and 64T and matches with the impedance between the transmission power amplifier 12 and the transmission filters 63T and 64T.

The reception input matching circuit 40 includes matching circuits 41 and 42. The matching circuit 41 is placed on a reception path connecting the reception low-noise amplifier 21 and the reception filters 61R and 62R and matches with the impedance between the reception low-noise amplifier 21 and the reception filters 61R and 62R. The matching circuit 42 is placed on a reception path connecting the reception low-noise amplifier 22 and the reception filters 63R and 64R and matches with the impedance between the reception low-noise amplifier 22 and the reception filters 63R and 64R.

The switch 51 is placed on a transmission path connecting the matching circuit 31 and the transmission filters 61T and 62T and switches an electrical connection between the transmission power amplifier 11 and the transmission filter 61T and an electrical connection between the transmission power amplifier 11 and the transmission filter 62T. The switch 52 is placed on a transmission path connecting the matching circuit 32 and the transmission filters 63T and 64T and switches an electrical connection between the transmission power amplifier 12 and the transmission filter 63T and an electrical connection between the transmission power amplifier 12 and the transmission filter 64T. The switch 53 is placed on a reception path connecting the matching circuit 41 and the reception filters 61R and 62R and switches an electrical connection between the reception low-noise amplifier 21 and the reception filter 61R and an electrical connection between the reception low-noise amplifier 21 and the reception filter 62R. The switch 54 is placed on a reception path connecting the matching circuit 42 and the reception filters 63R and 64R and switches an electrical connection between the reception low-noise amplifier 22 and the reception filter 63R and an electrical connection between the reception low-noise amplifier 22 and the reception filter 64R.

The switch 55 is placed on a signal path connecting the common terminal 100 and the transmission filters 61T to 64T and the reception filters 61R to 64R and switches: (1) an electrical connection between the common terminal 100 and the transmission filter 61T and the reception filter 61R, (2) an electrical connection between the common terminal 100 and the transmission filter 62T and the reception filter 62R, (3) an electrical connection between the common terminal 100 and the transmission filter 63T and the reception filter 63R, and (4) an electrical connection between the common terminal 100 and the transmission filter 64T and the reception filter 64R. Note that the switch 55 includes a multi-connection-type switch circuit capable of making two or more connections of the foregoing (1) to (4).

The matching circuit 71 is placed on a path connecting the switch 55 and the transmission filter 61T and the reception filter 61R. The matching circuit 72 is placed on a path connecting the switch 55 and the transmission filter 62T and the reception filter 62R. The matching circuit 73 is placed on a path connecting the switch 55 and the transmission filter 63T and the reception filter 63R. The matching circuit 74 is placed on a path connecting the switch 55 and the transmission filter 64T and the reception filter 64R.

The coupler 80 and the switch 56 are a circuit for monitoring power strength of a high frequency signal being transmitted between the common terminal 100 and the switch 55 and outputs the monitored power strength to RFIC 3 or the like via the coupler output terminal 180.

The foregoing circuit configuration enables the high frequency module 1 to perform a simultaneous transmission, a simultaneous reception, or a simultaneous transmission-and-reception of a high frequency signal of the communication band A or the communication band B and a high frequency signal of the communication band C or the communication band D.

Note that the transmission filters 61T to 64T, the reception filters 61R to 64R, the transmission power amplifier 12, the reception low-noise amplifiers 21 and 22, the matching circuits 31, 32, 41, 42, 71 to 74, the coupler 80, the switches 51 to 56, and the coupler output terminal 180 are not essential constituting elements of the high frequency module according to the present disclosure. That is, the high frequency module 1 according to the present embodiment only needs to be a circuit that transmits a high frequency signal of the communication band A and has a characteristic feature in a connection structure between the transmission power amplifier 11 and a mounting board (illustrated in FIG. 2A and FIG. 2B) on which the transmission power amplifier 11 is mounted.

2. Circuit Element Arrangement Configuration of High Frequency Module 1

Figure 2A:
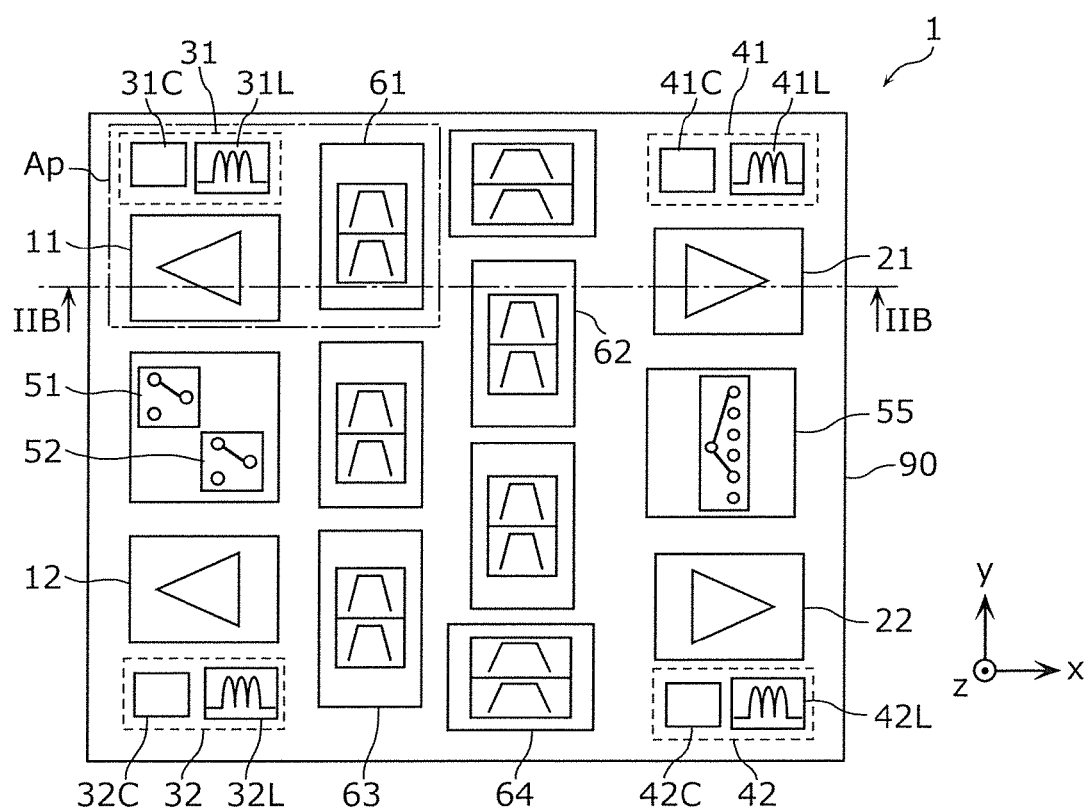
FIG. 2A is a schematic plan view illustrating a circuit arrangement of a high frequency module according to an embodiment.
Figure 2B:
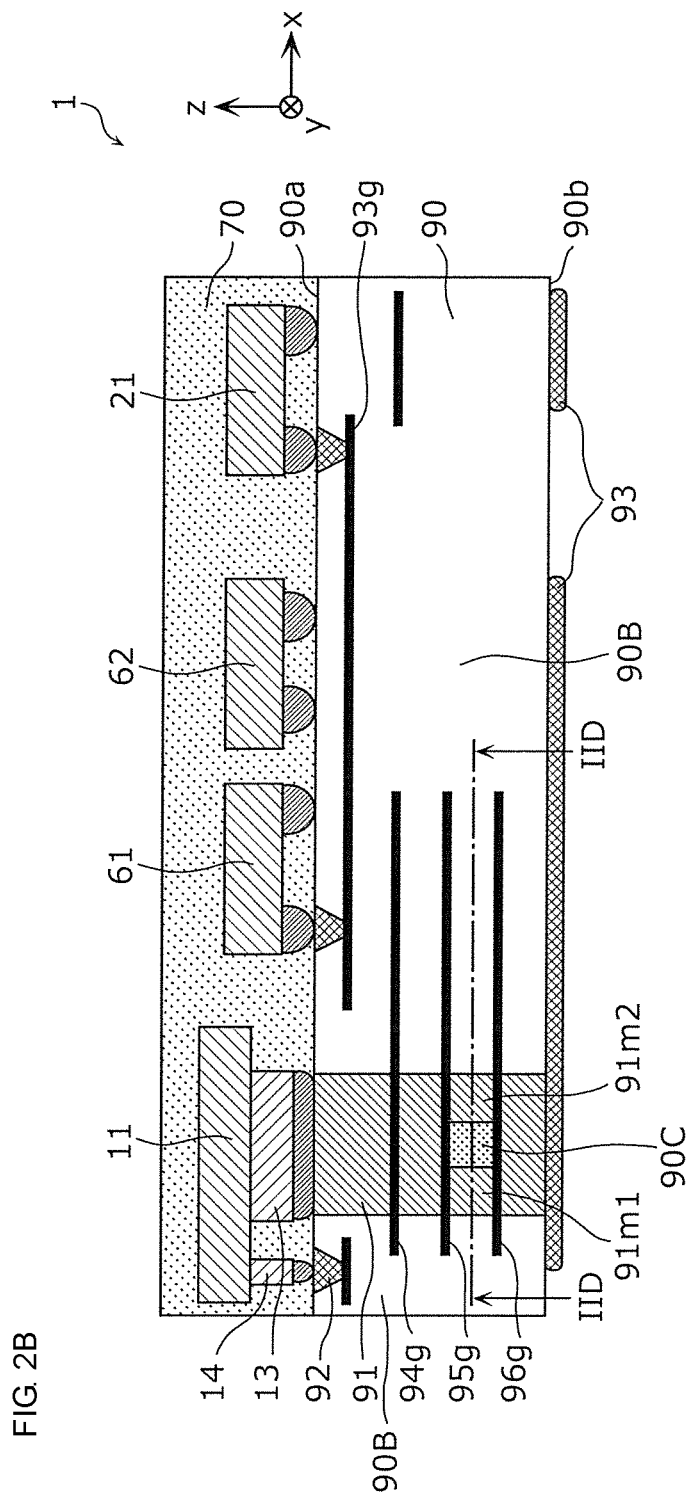
FIG. 2B is a schematic cross-sectional view of the high frequency module according to an embodiment.
Figure 2C:
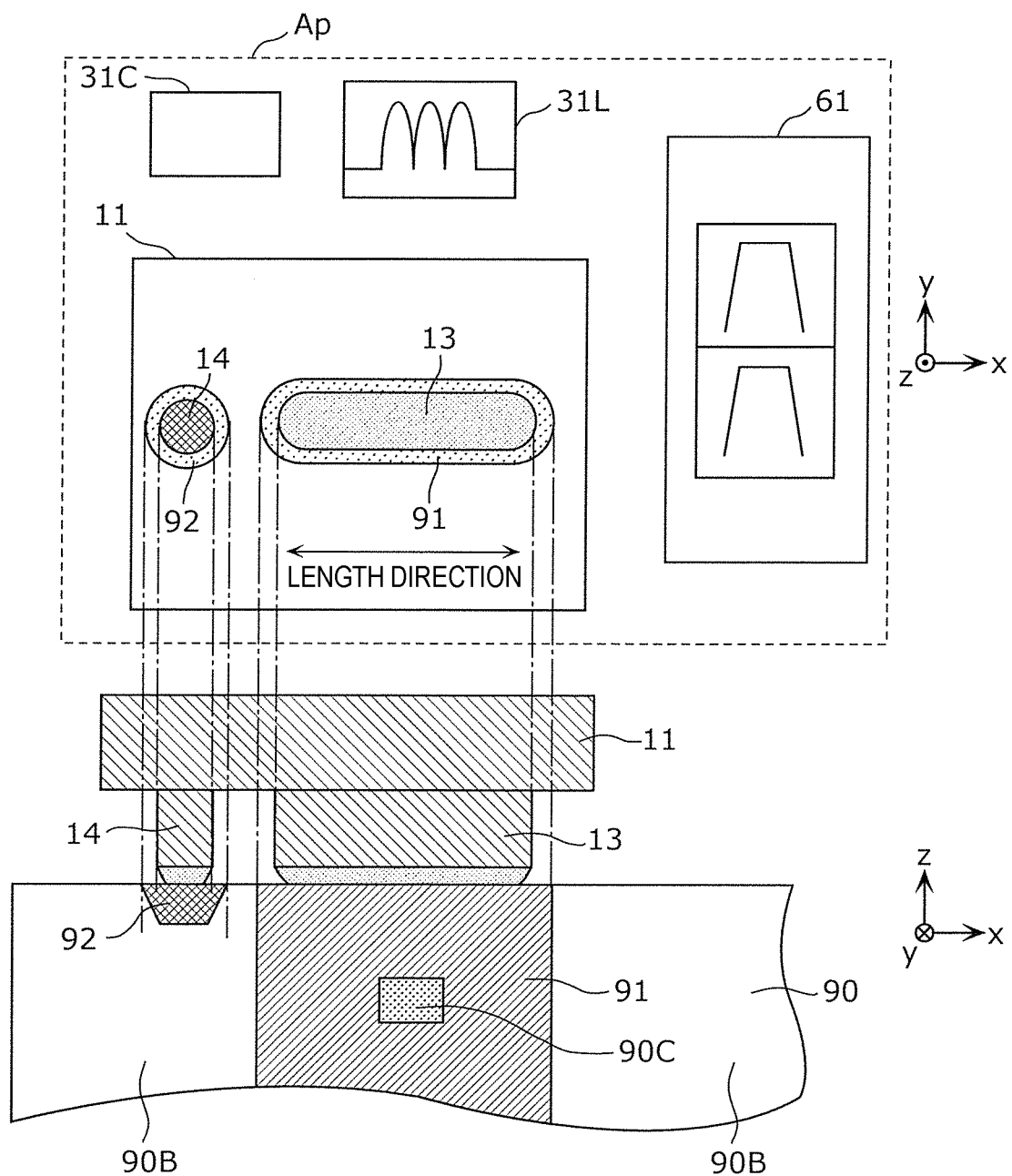
FIG. 2C is a schematic plan view illustrating a first mounting arrangement of a power amplifier included in the high frequency module according to an embodiment.
Figure 2D:
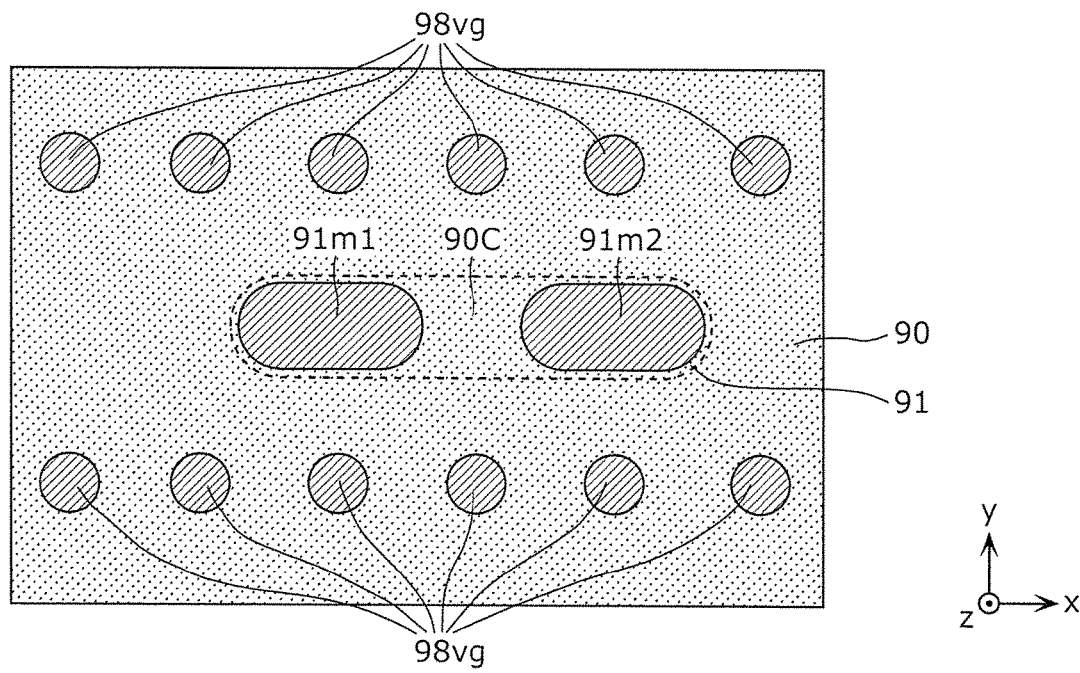
FIG. 2D is an inner-layer cross-sectional view of a mounting board included in the high frequency module according to an embodiment.

FIG. 2A is a schematic configuration plan view illustrating a circuit arrangement of the high frequency module 1 according to the embodiment. Further, FIG. 2B is a schematic cross-sectional view of the high frequency module 1 according to the embodiment. Further, FIG. 2C is a schematic plan view illustrating a first mounting arrangement of the transmission power amplifier 11 included in the high frequency module 1 according to the embodiment. Further, FIG. 2D is an inner-layer cross-sectional view of a mounting board 90 included in the high frequency module 1 according to the embodiment. More specifically, FIG. 2B is a cross-sectional view of FIG. 2A along the line IIB-IIB, FIG. 2C is a plan view of an area Ap on a principal surface 90a, where the transmission power amplifier 11 is mounted, and FIG. 2D is a cross-sectional view of FIG. 2B along the line IID-IID (fourth layer).

As illustrated in FIG. 2A and FIG. 2B, the high frequency module 1 according to the embodiment includes, in addition to the circuit configuration illustrated in FIG. 1, the mounting board 90 and a resin member 70.

The mounting board 90 has the principal surface 90a and a principal surface 90b, which are arranged back to back, and is a board on which the circuit elements illustrated in FIG. 1 are mounted. As the mounting board 90, for example, a multilayer board composed of resin, a low temperature co-fired ceramics (LTCC) multilayer board made up of a plurality of dielectric layers, or the like is used.

The resin member 70 is placed on the principal surface 90a of the mounting board 90, covers the circuit elements mounted on the principal surface 90a and the principal surface 90a of the mounting board 90, and has a functionality that ensures reliability such as mechanical strength, humidity resistance, and the like of the foregoing circuit elements. Note that the resin member 70 is not an essential constituting element of the high frequency module according to the present disclosure.

As illustrated in FIG. 2A and FIG. 2B, in the high frequency module 1 according to the present embodiment, the transmission power amplifiers 11 and 12, the reception low-noise amplifiers 21 and 22, the duplexers 61 to 64, the matching circuits 31, 32, 41, and 42, and the switches 51, 52, and 55 are surface-mounted on the principal surface 90a of the mounting board 90. Alternatively, the transmission power amplifier 12, the reception low-noise amplifiers 21 and 22, the duplexers 61 to 64, the matching circuits 31, 32, 41, and 42, and the switches 51, 52, and 55 may be mounted on the principal surface 90b of the mounting board 90. Further, although it is not illustrated in FIG. 2A or FIG. 2B, the switches 53, 54, and 56, the matching circuits 71 to 74, and the coupler 80 may be surface-mounted on either the principal surface 90a or the principal surface 90b of the mounting board 90, or may be embedded in the mounting board 90.

The matching circuit 31 includes an inductor 31L and a capacitor 31C. The matching circuit 32 includes an inductor 32L and a capacitor 32C. The matching circuit 41 includes an inductor 41L and a capacitor 41C. The matching circuit 42 includes an inductor 42L and a capacitor 42C.

As illustrated in FIG. 2A, in the plan view of the mounting board 90, the transmission power amplifiers 11 and 12, the matching circuits 31 and 32, and the switch 51 and 52, which are transmission circuit elements, are placed in a left-side area of the mounting board 90. On the other hand, the reception low-noise amplifiers 21 and 22 and the matching circuits 41 and 42, which are reception circuit elements, are placed in a right-side area of the mounting board 90. Further, in the plan view of the principal surface 90a of the mounting board 90, the duplexers 61 to 64 are placed (in a center area) between the transmission circuit elements and the reception circuit elements. This allows a transmission system circuit and a reception system circuit of the high frequency module 1 to be separated from each other with the duplexers interposed therebetween and enables to improve isolation between the transmission system circuit and the reception system circuit.

Further, as illustrated in FIG. 2B, the high frequency module 1 includes a bump electrode 13 (first bump electrode) connected to a principal surface of the transmission power amplifier 11 and having an elongated shape in the plan view of this principal surface. Compared with the related art, the elongated-shape bump electrode 13 enables to improve the heat dissipation ability of the transmission power amplifier 11.

Note that the electrode to be connected to the principal surface of the high frequency module 1 may not need to be the elongated-shape bump electrode 13 and may be a substantially rectangular or circular connection electrode.

Further, as illustrated in FIG. 2B and FIG. 2C, the mounting board 90 includes a board main part 90B formed of an insulating material and a via conductor 91 having an elongated shape in the plan view of the mounting board 90.

The board main part 90B is an example of a first insulating part and placed outside the via conductor 91 in the foregoing plan view. More specifically, the board main part 90B is arranged in such a manner as to surround the via conductor 91 in the foregoing plan view.

The via conductor 91 is an electrode penetrating through the mounting board 90 in a direction substantially perpendicular to the principal surfaces 90a and 90b, and an insulating part 90C is placed inside the via conductor 91. The insulating part 90C is an example of a second insulating part and is composed of an insulating material of the same kind as the insulating material that composes the board main part 90B. In the present embodiment, the insulating part 90C is placed in the fourth layer of the mounting board 90. Note that "the board main part 90B and the insulating part 90C are each composed of an insulating material of the same kind" is defined to mean that the composition of a main material that composes the board main part 90B is the same as the composition of a main material that composes the insulating part 90C. Further, the main material that composes an object is defined as a material of the highest content rate out of materials that compose the object.

FIG. 2D is a cross-sectional view along the line IID-IID in FIG. 2B. In the foregoing plan view, a center part (area enclosed by the dashed line) of the fourth layer is an area where the via conductor 91 is formed, and in this center part, a conductor pattern 91m1 and a conductor pattern 91m2 that form the via conductor 91 are placed. Further, the insulating part 90C is placed in an area inside the foregoing center part between the conductor patterns 91m1 and 91m2. Further, the insulating part 90C is not placed in center parts of the first layer, the second layer, and the third layer, and only the conductor patterns are placed therein. Further, in a surrounding area that surrounds the periphery of the foregoing center part, a plurality of ground vias 98vg each having a substantially cylindrical shape (substantially circular shape when viewed on the plane of the fourth layer) is placed. Alternatively, the insulating part 90C may be placed in any of the layers forming the mounting board 90 or may be formed across a plurality of the layers. Further, the insulating part 90C may be discretely formed in a plurality of layers that are not adjacent to each other.

That is, the high frequency module 1 according to the present embodiment includes the transmission power amplifier 11, the connection electrode (or the bump electrode 13) connected to the transmission power amplifier 11, and the mounting board 90, and the mounting board 90 includes the board main part 90B formed of an insulating material and the via conductor 91 placed inside the mounting board 90 and having an elongated shape in the plan view of the mounting board 90. Here, the connection electrode (or bump electrode 13) and the via conductor 91 are connected in an overlapping manner in the foregoing plan view, and the insulating part 90C composed of the foregoing insulating material is placed inside the via conductor 91.

The elongated-shape via conductor 91 formed inside the mounting board 90 is suitable as a member capable of efficiently dissipating the heat generated at the high frequency module 1 in which the transmission power amplifier 11 is installed.

The elongated-shape via conductor 91 is formed, for example, by opening a hole in the mounting board 90 using a laser or the like and then filling the hole with a conducting member (for example, conductive paste) such as silver (Ag), copper (Cu), or the like, or using a similar method. Since the elongated-shape via conductor 91 does not have a perfect circle shape in the foregoing plan view, the filling amount of the conducting member in a via-inner-circumference area is less than that of a via-outer-circumference area in some cases when filling the conducting member at the time of the formation of the via conductor 91. Because of this, in the case where the via conductor is formed by filling an elongated-shape via hole only with a conducting member, it is expected that a depressed part is likely to be formed on the surface of the mounting board 90 in the via-inner-circumference area compared with the via-outer-circumference area, thereby making it difficult to ensure the flatness of the via conductor on the surface of the mounting board 90. Further, when a large via is formed in the mounting board 90, the balance of the stress on the mounting board 90 is lost, and swelling, warping, or the like occurs over the entire mounting board 90, thereby making it difficult to ensure the flatness of the mounting board 90.

On the other hand, according to the foregoing configuration of the mounting board 90 in accordance with the present embodiment, the board main part 90B is placed outside the via conductor 91, and the insulating part 90C is placed inside the via conductor 91. The board main part 90B and the insulating part 90C are each composed of an insulating material of the same kind. Further, the bump electrode 13 and the via conductor 91 are connected while at least partially overlapping each other in the foregoing plan view. Because of this, the formation of a depressed part is suppressed on the surface of the mounting board 90 substantially vertically above (positive direction in Z axis) an area inside the via conductor 91 where the insulating part 90C is placed, thereby ensuring the flatness of the via conductor 91 on that surface. This enables to ensure the flatness of the surface of the mounting board 90 while improving the heat dissipation ability of the high frequency module 1. Further, the insulating part 90C placed inside the via conductor 91 enables to reduce the stress imbalance on the mounting board 90, thereby suppressing swelling, warping, or the like in the mounting board 90.

Note that, in the present embodiment, as illustrated in FIG. 2C and FIG. 2D, the insulating part 90C is placed in the center area in a length direction of the via conductor 91 in the foregoing plan view.

Note that the elongated shape is a shape elongated in one direction, and the length direction denotes this direction.

This causes the insulating part 90C to be placed in the via conductor 91 having an elongated shape in the center area in the length direction where a depressed part is likely to be formed. Therefore, the density of the conducting filling in the via-outer-circumference area and the via-inner-circumference area becomes uniform, thereby effectively ensuring the flatness of the via conductor 91 on the surface of the mounting board 90.

Alternatively, a plurality of insulating parts 90C may be placed inside the via conductor 91 in such a way that the plurality of insulating parts 90C is discretely arranged along the length direction of the via conductor 91 in the foregoing plan view.

This enables to place the insulating parts 90C in relation to an area in the via conductor 91 having an elongated shape, where the probability of forming a depressed part on the surface of the mounting board 90 is high, thereby ensuring the highly accurate flatness of the via conductor 91 on the surface of the mounting board 90.

Further, in the high frequency module 1 according to the present embodiment, as illustrated in FIG. 2B and FIG. 2C, the length direction of the via conductor 91 and the length direction of the bump electrode 13 are aligned in the foregoing plan view, and the via conductor 91 and the bump electrode 13 are connected in an overlapping area where the via conductor 91 and the bump electrode 13 overlap at least partially in the foregoing plan view. Here, the foregoing overlapping area of the via conductor 91 and the bump electrode 13 is an area elongated in the foregoing length direction. Here, "the length directions are aligned" is not limited to the state where the length direction of the via conductor 91 and the length direction of the bump electrode 13 are substantially parallel to each other, but also includes the state where an angle formed by the length direction of the via conductor 91 and the length direction of the bump electrode 13 is equal to or less than about 45 degrees. Further, "the overlapping area elongated in the foregoing length direction" is an area where an area of the bump electrode 13 elongated in the foregoing length direction in the foregoing plan view and an area of the via conductor 91 elongated in the foregoing length direction in the foregoing plan view overlap.

According to this, the elongated-shape bump electrode 13 and the elongated-shape via conductor 91 are connected along their length directions. Therefore, compared with the related art, the contact area between the bump electrode 13 and the via conductor 91 is larger, and further, the volumes of the bump electrode 13 and the via conductor 91 are larger since the bump electrode 13 and the via conductor 91 both have an elongated shape. Accordingly, the improvement of the heat dissipation ability of the high frequency module 1 becomes possible.

Note that, in the case where an electrode to be connected to a principal surface of the high frequency module 1 is a substantially rectangular or circular connection electrode, the connection electrode and the via conductor 91 are connected in an overlapping manner in the foregoing plan view.

Note that the bump electrode 13 is, for example, a column-like electrode whose main component is copper (Cu). This enables the bump electrode 13 to be formed easily into the foregoing elongated shape using electrolytic or non-electrolytic plating or the like, and also enables to reduce thermal resistance compared with other metallic materials. Accordingly, simplification of the fabrication process and further improvement of the heat dissipation ability are achieved.

Further, as illustrated in FIG. 2B, in the high frequency module 1 according to the present embodiment, ground electrodes 93g to 96g formed in inner layers of the mounting board 90 and backside ground electrodes 93 formed on the principal surface 90b of the mounting board are formed in the mounting board 90. The ground electrode 93g is an inner-layer ground pattern formed in the first layer from the principal surface 90a of the mounting board 90. The ground electrode 94g is an inner-layer ground pattern formed in the second layer from the principal surface 90a of the mounting board 90. The ground electrode 95g is an inner-layer ground pattern formed in the third layer from the principal surface 90a of the mounting board 90. The ground electrode 96g is an inner-layer ground pattern formed in the fourth layer from the principal surface 90a of the mounting board 90. The backside ground electrode 93 is a conductor pattern formed on the principal surface 90b of the mounting board 90 and is connected to the via conductor 91.

Here, the ground electrode 94g to 96g are connected to the via conductor 91 and to other circuit elements as needed (not illustrated). On the other hand, the ground electrode 93g is connected to other circuit elements such as the duplexer 61, the reception low-noise amplifier 21, and the like, but is not connected to the via conductor 91. That is, the via conductor 91 for dissipating the heat from the transmission power amplifier 11 is not connected to the ground electrode 93g formed in the irst layer of the mounting board 90, but is connected to the ground electrodes 94g to 96g formed in the second and succeeding layers of the mounting board 90. This suppresses the dissipation of the heat generated at the transmission power amplifier 11 via the ground electrode 93g near the transmission power amplifier 11. Accordingly, it becomes possible to suppress the heat received by circuit elements other than the transmission power amplifier 11, which form the high frequency module 1, the heat being generated at the transmission power amplifier 11, thereby ensuring highly accurate circuit operation of the high frequency module 1.

Figure 3:
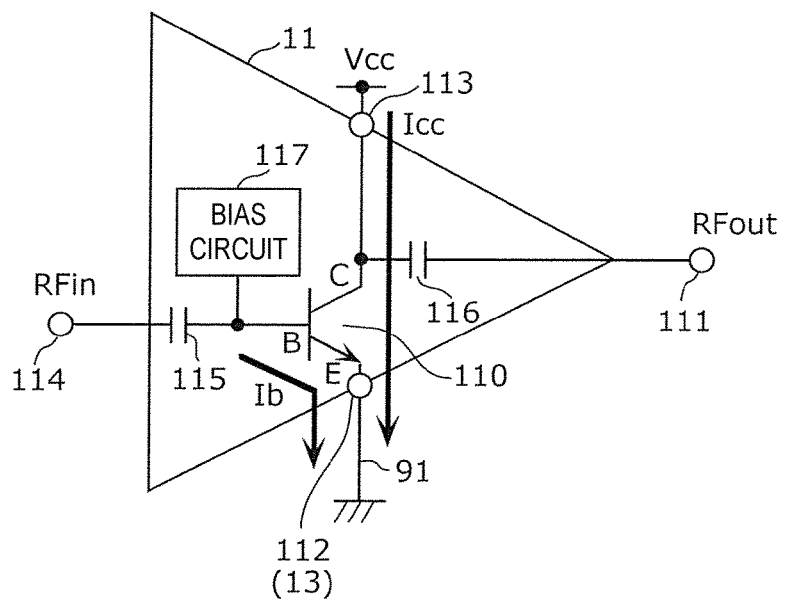
FIG. 3 is a circuit configuration diagram of a power amplifier according to an embodiment.

FIG. 3 is a circuit configuration diagram of the transmission power amplifier 11 according to the embodiment. As illustrated in this figure, the transmission power amplifier 11 includes an amplifier transistor 110, capacitors 115 and 116, a bias circuit 117, a collector terminal 113, an emitter terminal 112, an input terminal 114, and an output terminal 111.

The amplifier transistor 110 is, for example, a grounded-emitter type bipolar transistor including a collector, an emitter, and a base, and is an amplifier element that amplifies a high frequency current input to the base and outputs the amplified high frequency current from the collector. Alternatively, the amplifier transistor 110 may be a field-effect type transistor including a drain (corresponding to the collector), a source (corresponding to the emitter), and a gate (corresponding to the base).

The capacitor 115 is a DC-cut capacitor element and has a functionality to prevent the leakage of a direct current to the input terminal 114 using a direct-current bias voltage applied to the base from the bias circuit 117.

The capacitor 116 is a DC-cut capacitor element, has a functionality to remove a direct-current component in an amplified high frequency signal to which the direct-current bias voltage is superposed, and outputs, from the output terminal 111, an amplified high frequency signal from which the direct-current component has been removed.

The bias circuit 117 is connected to the base of the amplifier transistor 110 and has a functionality to optimize an operation point of the amplifier transistor 110 by applying the bias voltage to the base.

The emitter terminal 112 is connected to the bump electrode 13 (first bump electrode) and to ground via the bump electrode 13 and the via conductor 91.

According to the foregoing circuit configuration of the transmission power amplifier 11, a high frequency signal RFin inputted from the input terminal 114 forms a base current Ib flowing from the base to the emitter of the amplifier transistor 110. The base current Ib is amplified by the amplifier transistor 110 and forms a collector current Icc, and a high frequency signal RFout corresponding to the collector current Icc is outputted from the output terminal 111. At this time, a large current obtained by adding the base current Ib and the collector current Icc flows from the emitter terminal 112 to the ground. Accordingly, in order to improve the heat dissipation ability of the transmission power amplifier 11, it is necessary to improve the heat dissipation ability of the emitter terminal 112 that needs to function as a heat dissipating part of the amplifier transistor 110.

In response to this, since the emitter terminal 112 through which the large current flows is connected to the ground via the bump electrode 13 (first bump electrode) and the via conductor 91, it becomes possible to effectively increase the heat dissipation ability of the high frequency module 1 including the transmission power amplifier 11.

Further, as illustrated in FIG. 2B and FIG. 2C, the high frequency module 1 according to the present embodiment further includes a bump electrode 14 (second bump electrode) connected to a principal surface of the transmission power amplifier 11. The bump electrode 14 is connected to the output terminal 111 or the collector terminal 113 or both of the transmission power amplifier 11. Further, the bump electrode 14 is connected to a substantially circular via conductor 92 formed in the mounting board 90. Here, in the foregoing plan view, the area of the bump electrode 13 (first bump electrode) is larger than the area of the bump electrode 14 (second bump electrode).

According to this, the area of the bump electrode 13 in the foregoing plan view, where a large current flows, is larger than the area of the bump electrode 14 in the foregoing plan view, where a high frequency signal or a power supply voltage Vcc is applied, thereby optimizing the heat dissipation ability of the transmission power amplifier 11.

FIG. 4A is a schematic plan view illustrating a second mounting arrangement of the transmission power amplifier 11 included in a high frequency module 1A according to a modified example 1 of the embodiment. This figure is a first modified example of the electrode connection configuration in the principal surface 90a of an area Ap where the transmission power amplifier 11 is mounted. Compared with the first mounting arrangement of the transmission power amplifier 11 illustrated in FIG. 2C, the second mounting arrangement of the transmission power amplifier 11 illustrated in FIG. 4A is different in spatial relationship between the bump electrode 13 and the via conductor 91.

The mounting board 90 includes, in addition to the via conductors 91 and 92, the board main part 90B which is a main part of the mounting board 90 and placed outside the via conductor 91. Note that the insulating part 90C is placed inside the via conductor 91. The board main part 90B and the insulating part 90C are each composed of an insulating material of the same kind.

In the second mounting arrangement of the transmission power amplifier 11 according to the present modified example, the bump electrode 13 includes an area that does not overlap the via conductor 91 but overlaps the board main part 90B in the foregoing plan view. That is, as illustrated in FIG. 4A, in the foregoing plan view, the bump electrode 13 and the via conductor 91 are connected while at least partially overlapping each other, and their length directions are aligned, but the bump electrode 13 and the via conductor 91 do not overlap completely. In other words, as illustrated in FIG. 4A, the length direction of the bump electrode 13 and the length direction of the via conductor 91 are aligned in the foregoing plan view, and the bump electrode 13 and the via conductor 91 are connected in an overlapping area where the bump electrode 13 and the via conductor 91 overlap, the overlapping area being elongated at least in the foregoing length direction in the foregoing plan view. Here, "the overlapping area elongated in the foregoing length direction" is an area where an area of the bump electrode 13 elongated in the foregoing length direction, out of the area of the bump electrode 13 in the foregoing plan view, and an area of the via conductor 91 elongated in the foregoing length direction, out of the area of the via conductor 91 in the foregoing plan view, overlap.

This enables the bump electrode 13 to partially overlap the via conductor 91 in the foregoing plan view and further overlap the board main part 90B, which is placed around the periphery of the via conductor 91, at the remaining part, thereby further ensuring the flatness on the mounting board 90 while ensuring the heat dissipation ability of the high frequency module 1A.

Further, since the bump electrode 13 and the via conductor 91 do not need to overlap completely, the arrangement position of the via conductor 91 in the mounting board 90 can be selected freely to some extent, thereby enabling to change a heat dissipating area within the mounting board 90. Particularly, this enables to place the via conductor 91 away from a component whose characteristics change greatly due to heat or a similar component, thereby stabilizing the electrical characteristics of the high frequency module 1A.

Alternatively, the area of the via conductor 91 on the principal surface 90a may be reduced to less than the area of the bump electrode 13. This enables to downsize the via conductor 91, thereby improving the flexibility in the wiring design inside the mounting board 90.

FIGS. 4B and 4C are a schematic plan view and a cross-sectional view illustrating a third mounting arrangement of the transmission power amplifier 11 included in a high frequency module 1B according to a modified example 2 of the embodiment. These figures are a second modified example of the electrode connection configuration in the principal surface 90a of the area Ap where the transmission power amplifier 11 is mounted. Compared with the second mounting arrangement of the transmission power amplifier 11 illustrated in FIG. 4A, the third mounting arrangement of the transmission power amplifier 11 illustrated in FIGS. 4B and 4C is different in that a connection electrode 97 is placed between the bump electrode 13 and the via conductor 91.

The connection electrode 97 is a conductor electrode placed on the principal surface 90a of the mounting board 90, and is, as illustrated in FIG. 4B, a plane conducting layer interposed between the bump electrode 13 and the via conductor 91 in a cross-sectional view and connecting the bump electrode 13 and the via conductor 91. Further, as illustrated in FIG. 4C, in the foregoing plan view, the connection electrode 97 contains the bump electrode 13 and further contains the via conductor 91. Note that the insulating part 90C composed of the foregoing insulating material is placed inside the via conductor 91.

Note that, as with the second mounting arrangement, in the third mounting arrangement, the bump electrode 13 includes an area that does not overlap the via conductor 91 but overlaps the board main part 90B in the foregoing plan view. That is, as illustrated in FIG. 4B, the length direction of the bump electrode 13 and the length direction of the via conductor 91 are aligned, but the bump electrode 13 and the via conductor 91 do not overlap completely.

According to the third mounting arrangement, in the foregoing plan view, the bump electrode 13 partially overlaps the via conductor 91 and further overlap the board main part 90B at the remaining part, and further the connection electrode 97 contains the bump electrode 13 and the via conductor 91 in the foregoing plan view. That is, connecting the bump electrode 13 and the via conductor 91 via the connection electrode 97 enables to improve the connection reliability between the bump electrode 13 and the via conductor 91, thereby further improving the heat dissipation ability of the high frequency module 1B. Further, the flexibility in the arrangement position of the via conductor 91 in the mounting board 90 is ensured. In addition, connecting the bump electrode 13 and the board main part 90B enables to ensure the flatness of the transmission power amplifier 11 on the mounting board 90.

3. Circuit Configuration and Electrode Arrangement Configuration of Multiple-stage Power Amplifier FIG. 5 is a circuit configuration diagram of a transmission power amplifier 11A included in a high frequency module 1C according to a modified example 3 of the embodiment. The transmission power amplifier 11A according to the present modified example has a configuration including two stages of amplifier transistors forming a cascading connection with each other. As illustrated in FIG. 5, the transmission power amplifier 11A includes a first power amplifier 11P and a second power amplifier 11D.

The first power amplifier 11P includes an amplifier transistor 110P, capacitors 115P and 116P, a bias circuit 117P, a collector terminal 113P, an emitter terminal 112P, an input terminal 114P, and an output terminal 111.

The amplifier transistor 110P is a first amplifier element placed in the last stage (power stage) of a plurality of amplifier transistors and is, for example, a grounded-emitter type bipolar transistor including a collector, an emitter, and a base, and amplifies a high frequency current input to the base and outputs the amplified high frequency current from the collector. Alternatively, the amplifier transistor 110P may be a field-effect type transistor including a drain (corresponding to the collector), a source (corresponding to the emitter), and a gate (corresponding to the base).

The second power amplifier 11D includes an amplifier transistor 110D, capacitors 115D and 116D, a bias circuit 117D, a collector terminal 113D, an emitter terminal 112D, an input terminal 114, and an output terminal 111D.

The amplifier transistor 110D is a second amplifier element placed in a preceding stage (drive stage) followed by the amplifier transistor 110P placed in the last stage and is, for example, a grounded-emitter type bipolar transistor including a collector, an emitter, and a base, and amplifies a high frequency current input to the base and outputs the amplified high frequency current from the collector. Alternatively, the amplifier transistor 110D may be a field-effect type transistor including a drain (corresponding to the collector), a source (corresponding to the emitter), and a gate (corresponding to the base).

The capacitors 115P and 115D are each a DC-cut capacitor element and each have a functionality similar to that of the capacitor 115. The capacitors 116P and 116D are each a DC-cut capacitor element and each have a functionality similar to that of the capacitor 116. The bias circuits 117P and 117D are respectively connected to the bases of the amplifier transistors 110P and 110D and each have a functionality similar to that of the bias circuit 117.

Here, the emitter terminal 112P is connected to the bump electrode 13P and to the ground via the bump electrode 13P and the via conductor 91P.

According to the foregoing circuit configuration of the transmission power amplifier 11A according to the present modified example, a high frequency signal RFin inputted from the input terminal 114 becomes a base current Ib1 flowing from the base to the emitter of the amplifier transistor 110D. The base current Ib1 is amplified by the amplifier transistor 110D and forms a collector current Icc1, and a high frequency signal corresponding to the collector current Icc1 is outputted from the output terminal 111D (input terminal 114P). Further, the high frequency signal amplified by the amplifier transistor 110D forms a base current Ib2 flowing from the base to the emitter of the amplifier transistor 110P through the input terminal 114P. The base current Ib2 is amplified by the amplifier transistor 110P and forms a collector current Icc2, and a high frequency signal corresponding to the collector current Icc2 is outputted from the output terminal 111. At this time, a large current obtained by adding the base current Ib2 and the collector current Icc2 flows from the emitter terminal 112P to the ground.

FIG. 6A is a schematic plan view illustrating a fourth mounting arrangement of the transmission power amplifier 11A included in a high frequency module 1C according to the modified example 3 of the embodiment. This figure is a plan view illustrating the fourth mounting arrangement on the principal surface 90a of the area Ap where the transmission power amplifier 11A according to the present modified example is mounted. The high frequency module 1C according to the present modified example is connected to a principal surface of the transmission power amplifier 11A and includes, in the plan view of this principal surface, an elongated-shape bump electrode 13P, an elongated-shape bump electrode 13D, a substantially circular bump electrode 14P, and a substantially circular bump electrode 14D.

Further, the mounting board 90 includes, in the plan view of the mounting board 90, an elongated-shape via conductor 91P and substantially circular via conductors 91d1, 91d2, 91d3, 92P, and 92D.

Here, the emitter terminal 112P is connected to the bump electrode 13P and to the ground via the bump electrode 13P and the via conductor 91P. Further, the emitter terminal 112D is connected to the bump electrode 13D and to the ground via the bump electrode 13D and the via conductors 91d1 to 91d3.

As illustrated in FIG. 6A, an insulating part 90C1 is placed inside the via conductor 91P. The main part of the mounting board 90, which is placed outside the via conductor 91P, and the insulating part 90C1 are each composed of an insulating material of the same kind. Because of this, the formation of a depressed part is suppressed on the surface of the mounting board 90 substantially vertically above (positive direction in Z axis) an area inside the via conductor 91P where the insulating part 90C1 is placed, thereby ensuring the flatness of the via conductor 91P on that surface. This enables to ensure the flatness of the surface of the mounting board 90 while improving the heat dissipation ability of the high frequency module 1C.

Alternatively, a plurality of insulating parts 90C1 may be placed inside the via conductor 91P in such a way that the plurality of insulating parts 90C1 is discretely arranged along the length direction of the via conductor 91P in the foregoing plan view.

This enables to place the insulating parts 90C1 in relation to an area in the via conductor 91P having an elongated shape, where the probability of forming a depressed part on the surface of the mounting board 90 is high, thereby ensuring highly accurate flatness of the via conductor 91P on the surface of the mounting board 90.

Further, the length direction of the bump electrode 13P and the length direction of the via conductor 91P are aligned in the foregoing plan view, and the bump electrode 13P and the via conductor 91P are connected in an overlapping area where the bump electrode 13P and the via conductor 91P overlap, the overlapping area being elongated at least in the foregoing length direction in the foregoing plan view. Further, the bump electrode 13D and the via conductors 91d1 to 91d3 are connected while overlapping each other in the foregoing plan view.

Further, the bump electrode 14P is connected to the substantially circular via conductor 92P while overlapping each other in the foregoing plan view, and the bump electrode 14D is connected to the substantially circular via conductor 92D while overlapping each other in the foregoing plan view.

According to this, of a plurality of the amplifier transistors 110D and 110P, the amplifier transistor 110P having the highest output power is connected to the elongated-shape bump electrode 13P and the elongated-shape via conductor 91P. Further, the elongated-shape bump electrode 13P and the elongated-shape via conductor 91P are connected in such a way that the bump electrode 13P and the via conductor 91P overlap along their length directions in the foregoing plan view. Therefore, compared with the related art, the contact area between the bump electrode 13P and the via conductor 91P is larger, and further, the volumes of the bump electrode 13P and the via conductor 91P are larger. Accordingly, the heat dissipation of the transmission power amplifier 11A is achieved effectively.

Alternatively, in the present modified example, the via conductors 91d1 to 91d3, which are to be connected to the bump electrode 13D, may form a single elongated-shape via conductor. In this case, it is preferable to place an insulating part, which is composed of an insulating material that composes the main part of the mounting board 90, inside the foregoing via conductor. Because of this, the formation of a depressed part within the foregoing via conductor is suppressed on the surface of the mounting board 90, thereby ensuring the flatness of the via conductor on the surface. This enables to ensure the flatness of the surface of the mounting board 90 while improving the heat dissipation ability of the power amplifier in the drive stage.

FIG. 6B is a schematic plan view illustrating a fifth mounting arrangement of the transmission power amplifier 11A included in a high frequency module 1D according to a modified example 4 of the embodiment. This figure is a plan view illustrating the fifth mounting arrangement on the principal surface 90a of the area Ap where the transmission power amplifier 11A according to the present modified example is mounted. The high frequency module 1D according to the present modified example is connected to a principal surface of the transmission power amplifier 11A and includes, in the plan view of this principal surface, an elongated-shape bump electrode 13P, an elongated-shape bump electrode 13D, a substantially circular bump electrode 14P, and a substantially circular bump electrode 14D.

Further, the mounting board 90 includes, in the plan view of the mounting board 90, an elongated-shape via conductor 91Pa and substantially circular via conductors 91$d$1, 91$d$2, 91$d$3, 92P, and 92D.

Compared with the fourth mounting arrangement according to the modified example 3, the fifth mounting arrangement according to the present modified example is different only in the configuration of the via conductor 91Pa connected to the bump electrode 13P. The fifth mounting arrangement according to the present modified example is described below with the emphasis on the difference from the fourth mounting arrangement according to the modified example 3.

The emitter terminal 112P is connected to the bump electrode 13P and to the ground via the bump electrode 13P and the via conductor 91Pa. Further, the emitter terminal 112D is connected to the bump electrode 13D and to the ground via the bump electrode 13D and the via conductors 91$d$1 to 91$d$3.

As illustrated in FIG. 6B, the via conductor 91Pa has, in the foregoing plan view, an elongated shape with undulating (wave-like) long sides. This undulating shape on the long side is, for example, caused by the fabrication process of the via conductor 91Pa and formed by successively forming a plurality of substantially perfect-circle-shape via holes along one direction (x-axis direction) in a partially overlapping manner in (respective layers of) the main part forming the mounting board 90. This enables to form the elongated-shape via conductor 91Pa using a via hole forming tool for the substantially perfect-circle-shape via conductors 91$d$1 to 91$d$3 without preparing a dedicated via hole forming tool (laser fabricating equipment) only for the via conductor 91Pa. Accordingly, via conductors having various shapes and sizes can be formed using simplified fabrication processes.

Note that an insulating part 90C2 composed of an insulating material that composes the main part of the mounting board 90 is placed inside the via conductor 91Pa. Because of this, the formation of a depressed part is suppressed on the surface of the mounting board 90 substantially vertically above (positive direction in Z axis) an area inside the via conductor 91Pa where the insulating part 90C2 is placed, thereby ensuring the flatness of the via conductor 91Pa on that surface. This enables to ensure the flatness of the surface of the mounting board 90 while improving the heat dissipation ability of the high frequency module 1D.

Alternatively, a plurality of insulating parts 90C2 may be placed inside the via conductor 91Pa in such a way that the plurality of insulating parts 90C2 is discretely arranged along the length direction of the via conductor 91Pa in the foregoing plan view.

This enables to place the insulating parts 90C2 in relation to an area in the via conductor 91Pa having an elongated shape, where the probability of forming a depressed part on the surface of the mounting board 90 is high, thereby ensuring highly accurate flatness of the via conductor 91Pa on the surface of the mounting board 90.

Further, the length direction of the bump electrode 13P and the length direction of the via conductor 91Pa are aligned in the foregoing plan view, and the bump electrode 13P and the via conductor 91Pa are connected in an overlapping area where the bump electrode 13P and the via conductor 91Pa overlap, the overlapping area being elongated at least in the foregoing length direction in the foregoing plan view. Further, the bump electrode 13D and the via conductors 91$d$1 to 91$d$3 are connected while overlapping each other in the foregoing plan view.

Further, the bump electrode 14P is connected to the substantially circular via conductor 92P while overlapping each other in the foregoing plan view, and the bump electrode 14D is connected to the substantially circular via conductor 92D while overlapping each other in the foregoing plan view.

According to this, of a plurality of the amplifier transistors 110D and 110P, the amplifier transistor 110P having the highest output power is connected to the elongated-shape bump electrode 13P and the elongated-shape via conductor 91Pa. Further, the elongated-shape bump electrode 13P and the elongated-shape via conductor 91Pa are connected in such a way that the bump electrode 13P and the via conductor 91Pa overlap along their length directions in the foregoing plan view. Therefore, compared with the related art, the contact area between the bump electrode 13P and the via conductor 91Pa is larger, and further, the volumes of the bump electrode 13P and the via conductor 91Pa are larger since the bump electrode 13P and the via conductor 91Pa both have an elongated shape. Accordingly, the heat dissipation of the transmission power amplifier 11A is achieved effectively.

Note that, although the configuration including two stages of the amplifier transistors 110P and 110D are described as the transmission power amplifier 11A according to the modified example 3 and the modified example 4, the number of cascading-connected amplifier transistors is not limited to two stages but may alternatively be three stages or more. In this case, the power-stage amplifier transistor is an amplifier transistor in the last stage, and the drive-stage amplifier transistor is an amplifier transistor in one of preceding stages previous to the last stage.

Note that, in the high frequency modules according to the foregoing embodiment and the modified examples thereof, the elongated-shape bump electrode 13 (or 13P) is a bump electrode connected to the transmission power amplifier 11 (or 11A). Alternatively, the elongated-shape bump electrode 13 may be a bump electrode connected to the transmission power amplifier 12 or may be a bump electrode connected to the reception low-noise amplifier 21 or 22. Further, the bump electrode 13 may not be connected to an active element generating heat such as the transmission power amplifier or the reception low-noise amplifier, but may be connected to a passive element such as the transmission filter 61T, 62T, 63T or 64T, which is electrically connected to an output terminal of an amplifier.

Other Embodiments

The high frequency module and the communication device according to the present embodiment are described using the embodiment and the modified examples thereof. However, the high frequency module and the communication device according to the present disclosure are not limited to the foregoing embodiment and the modified examples thereof. Other embodiments realized by combining arbitrary constituting elements of the foregoing embodiment and the modified examples thereof, modified examples obtained by applying various modifications apparent to those skilled in the art to the foregoing embodiment and the modified examples thereof without departing the scope of the present disclosure, and various devices including the foregoing high frequency module and the foregoing communication device may also be included in the present disclosure.

For example, in the high frequency modules and the communication devices according to the foregoing embodiment and the modified examples thereof, another circuit element or wiring or the like may be inserted in a path connecting a circuit element and a signal path disclosed in the drawings.

The present disclosure can be widely used in communication devices such as cellular phones and the like as a high frequency module to be installed in a multiband front-end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A high frequency module comprising:
a high frequency component;
a connection electrode connected to the high frequency component; and
a mounting board on which the high frequency component is mounted, wherein
the mounting board includes
a via conductor having an elongated shape in a plan view of the mounting board,
a first insulating part disposed outside the via conductor, and
one or more second insulating parts disposed inside the via conductor,
the connection electrode and the via conductor are connected while at least partially overlapping one another in the plan view, and
the first insulating part and the one or more second insulating parts are each composed of an insulating material of same kind.

2. The high frequency module according to claim 1, wherein
the high frequency component is a power amplifier, a low-noise amplifier, and/or a filter electrically connected to an output terminal of a power amplifier.

3. The high frequency module according to claim 1, wherein
in the plan view, the one or more second insulating parts are disposed in a center area in a length direction of the via conductor.

4. The high frequency module according to claim 1, wherein
a plurality of the second insulating parts are discretely arranged along a length direction of the via conductor in the plan view.

5. The high frequency module according to claim 1, wherein
the connection electrode is a first bump electrode having an elongated shape in the plan view.

6. The high frequency module according to claim 5, wherein
a length direction of the first bump electrode and a length direction of the via conductor are aligned in the plan view, and the first bump electrode and the via conductor are connected in an overlapping area where the first bump electrode and the via conductor overlap at least partially in the plan view, and
the overlapping area is an area elongated in the length direction.

7. The high frequency module according to claim 5, wherein
the high frequency component is a power amplifier and includes a bipolar transistor having a base terminal, a collector terminal, and an emitter terminal, wherein a drive current flows through the bipolar transistor from the collector terminal to the emitter terminal, and
the emitter terminal is connected to ground via the first bump electrode and the via conductor.

8. The high frequency module according to claim 7, further comprising:
a second bump electrode connected to a principal surface of the high frequency component, wherein
the second bump electrode is connected to the base terminal and/or the collector terminal, and
in the plan view, an area of the first bump electrode is larger than an area of the second bump electrode.

9. The high frequency module according to claim 5, wherein
the high frequency component is a power amplifier and includes a field effect type transistor having a gate terminal, a drain terminal, and a source terminal, wherein a drive current flows through the field effect type transistor from the drain terminal to the source terminal, and
the source terminal is connected to ground via the first bump electrode and the via conductor.

10. The high frequency module according to claim 9, further comprising:
a second bump electrode connected to a principal surface of the high frequency component, wherein
the second bump electrode is connected to the gate terminal and/or the drain terminal, and
in the plan view, an area of the first bump electrode is larger than an area of the second bump electrode.

11. The high frequency module according to claim 5, wherein
the high frequency component is a power amplifier comprising a plurality of amplifier elements forming a cascading connection with one another,
the plurality of amplifier elements includes
a first amplifier element disposed in a last stage of the plurality of amplifier elements, and
a second amplifier element disposed in a preceding stage previous to the first amplifier element, and
the first bump electrode is connected to the first amplifier element.

12. The high frequency module according to claim 5, wherein
the first bump electrode is a column-like electrode comprising copper as a main component.

13. The high frequency module according to claim 5, wherein
the first bump electrode includes, in the plan view, an area not overlapping with the via conductor and overlapping with the first insulating part.

14. A communication device comprising:
a RF signal processing circuit processing a high frequency signal received in or transmitted from an antenna element; and
the high frequency module according to claim 1, the high frequency module transmitting the high frequency signal between the antenna element and the RF signal processing circuit.

15. The high frequency module according to claim 2, wherein
in the plan view, the one or more second insulating parts are disposed in a center area in a length direction of the via conductor.

16. The high frequency module according to claim 2, wherein
   a plurality of the second insulating parts are discretely arranged along a length direction of the via conductor in the plan view.

17. The high frequency module according to claim 2, wherein
   the connection electrode is a first bump electrode having an elongated shape in the plan view.

18. The high frequency module according to claim 3, wherein
   the connection electrode is a first bump electrode having an elongated shape in the plan view.

19. The high frequency module according to claim 4, wherein
   the connection electrode is a first bump electrode having an elongated shape in the plan view.

20. The high frequency module according to claim 6, wherein
   the high frequency component is a power amplifier and includes a bipolar transistor having a base terminal, a collector terminal, and an emitter terminal, wherein a drive current flows through the bipolar transistor from the collector terminal to the emitter terminal, and
   the emitter terminal is connected to ground via the first bump electrode and the via conductor.

* * * * *